United States Patent
Chang

(10) Patent No.: US 9,959,232 B2
(45) Date of Patent: May 1, 2018

(54) METHODS FOR EXECUTING DATA ACCESS COMMANDS AND FLASH MEMORY DEVICES USING THE SAME

(71) Applicant: Silicon Motion, Inc., Jhubei, Hsinchu County (TW)

(72) Inventor: Yu-Chuan Chang, New Taipei (TW)

(73) Assignee: SILICON MOTION, INC., Jhubei, Hsinchu County (TW)

(*) Notice: Subject to any disclaimer, the term of this patent is extended or adjusted under 35 U.S.C. 154(b) by 114 days.

(21) Appl. No.: 14/514,762

(22) Filed: Oct. 15, 2014

(65) Prior Publication Data
US 2015/0169250 A1   Jun. 18, 2015

(30) Foreign Application Priority Data
Dec. 12, 2013   (TW) .............................. 102145803 A

(51) Int. Cl.
*G06F 12/00* (2006.01)
*G06F 13/38* (2006.01)
*G11C 7/10* (2006.01)

(52) U.S. Cl.
CPC .......... *G06F 13/385* (2013.01); *G11C 7/1072* (2013.01)

(58) Field of Classification Search
CPC .. G11C 7/1072; G11C 7/1006; G06F 12/0246
See application file for complete search history.

(56) References Cited

U.S. PATENT DOCUMENTS

| | | | | |
|---|---|---|---|---|
| 4,245,300 A | * | 1/1981 | Kaufman | G06F 13/122 710/1 |
| 6,782,459 B1 | * | 8/2004 | Ware | G11C 7/1051 710/38 |
| 7,991,932 B1 | * | 8/2011 | Choksey | G06F 21/575 710/104 |
| 9,104,315 B2 | | 8/2015 | Sinclair | |
| 2002/0049888 A1 | | 4/2002 | Hertwig et al. | |
| 2003/0154354 A1 | * | 8/2003 | Goko | G06F 9/3802 711/163 |
| 2004/0107327 A1 | * | 6/2004 | Takahashi | G06F 13/385 711/170 |
| 2006/0293764 A1 | * | 12/2006 | Wang | G06F 13/385 700/10 |
| 2007/0033362 A1 | * | 2/2007 | Sinclair | G06F 3/0607 711/165 |
| 2007/0168624 A1 | * | 7/2007 | Kaler | G06F 3/0608 711/154 |

(Continued)

FOREIGN PATENT DOCUMENTS
CN   101238431 A   8/2008

*Primary Examiner* — Ryan Bertram
*Assistant Examiner* — Trang K Ta
(74) *Attorney, Agent, or Firm* — McClure, Qualey & Rodack, LLP

(57) ABSTRACT

An embodiment of a method for executing data access commands, performed by a control unit, is disclosed to include at least the following steps. A series of interface-driving instructions is read from a RAM (Random Access Memory) after detecting that an indication for altering instruction source has been written into a register. A storage-unit access interface is operated according to the interface-driving instructions, so as to complete data access to a storage unit.

17 Claims, 7 Drawing Sheets

(56) References Cited

U.S. PATENT DOCUMENTS

| | | | | |
|---|---|---|---|---|
| 2008/0155237 | A1* | 6/2008 | Dobson | G06F 9/325 |
| | | | | 712/241 |
| 2008/0301421 | A1* | 12/2008 | Hsu | G06F 9/30181 |
| | | | | 712/241 |
| 2009/0138687 | A1* | 5/2009 | Kang | G06F 13/4243 |
| | | | | 712/225 |
| 2009/0164704 | A1* | 6/2009 | Kanade | G06F 11/1068 |
| | | | | 711/103 |
| 2011/0131381 | A1* | 6/2011 | Kaplan | G06F 12/0875 |
| | | | | 711/141 |
| 2012/0063231 | A1* | 3/2012 | Wood | G11C 11/5628 |
| | | | | 365/185.18 |
| 2013/0262776 | A1* | 10/2013 | Asaro | G06F 12/0835 |
| | | | | 711/135 |
| 2014/0095774 | A1* | 4/2014 | Mollichelli | G06F 8/66 |
| | | | | 711/103 |
| 2015/0006869 | A1* | 1/2015 | Ehrlich | G06F 11/3636 |
| | | | | 712/244 |

* cited by examiner

METHODS FOR EXECUTING DATA ACCESS COMMANDS AND FLASH MEMORY DEVICES USING THE SAME

CROSS REFERENCE TO RELATED APPLICATIONS

This Application claims priority of Taiwan Patent Application No. 102145803, filed on Dec. 12, 2013, the entirety of which is incorporated by reference herein.

BACKGROUND

Technical Field

The present invention relates to flash memory devices, and in particular to methods for executing data access commands and flash memory devices using the same.

Description of the Related Art

Conventionally, in order to execute commands for accessing data stored in storage units of flash memory, firmware performed in the flash memory requires a consecutive time period to write registers for completing a series of asserting and de-asserting control signals of a storage-unit access interface, and/or specifying addresses, parameters, data, etc. associated with the commands. It typically consumes a time period for continuously writing five to twenty registers, which cannot be interrupted. However, the conventional design hinders optimization by a firmware when a number of data access commands are scheduled, making the data access efficiency hard to improve. Accordingly, what is needed are methods for executing data access commands to reduce the requisite consecutive time period for writing registers, and flash memory devices using the same. Therefore, a firmware may gain higher flexibility to optimize scheduling to multiple data access commands.

BRIEF SUMMARY

An embodiment of a method for executing data access commands, performed by a control unit, is disclosed to include at least the following steps. A series of interface-driving instructions is read from a RAM (Random Access Memory) after detecting that an indication for altering instruction source has been written into a register. A storage-unit access interface is operated according to the interface-driving instructions, so as to complete data access to a storage unit.

An embodiment of a flash memory device is disclosed to include at least a storage-unit access interface, a register, a RAM, and a control unit coupled between the register, the RAM and the storage-unit access interface. The control unit reads a series of interface-driving instructions from the RAM after detecting that an indication for altering instruction source has been written into the register; and operates the storage-unit access interface according to the interface-driving instructions, so as to complete data access to a storage unit.

An embodiment of a method for executing data access commands, performed by a firmware when being executed by a MCU (Micro-Control Unit), is disclosed to include at least the following steps. A series of interface-driving instructions is stored into a RAM other than a register. An indication for altering instruction source is written into the register for instructing a control unit to read the interface-driving instructions from the RAM and operate a storage-unit access interface according to the interface-driving instructions sequentially.

A detailed description is given in the following embodiments with reference to the accompanying drawings.

BRIEF DESCRIPTION OF THE DRAWINGS

The present invention can be fully understood by reading the subsequent detailed description and examples with references made to the accompanying drawings, wherein.

DETAILED DESCRIPTION

The following description is of the best-contemplated mode of carrying out the invention. This description is made for the purpose of illustrating the general principles of the invention and should not be taken in a limiting sense. The scope of the invention is best determined by reference to the appended claims.

The present invention will be described with respect to particular embodiments and with reference to certain drawings, but the invention is not limited thereto and is only limited by the claims. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having the same name (but for use of the ordinal term) to distinguish the claim elements.

Figure 1:
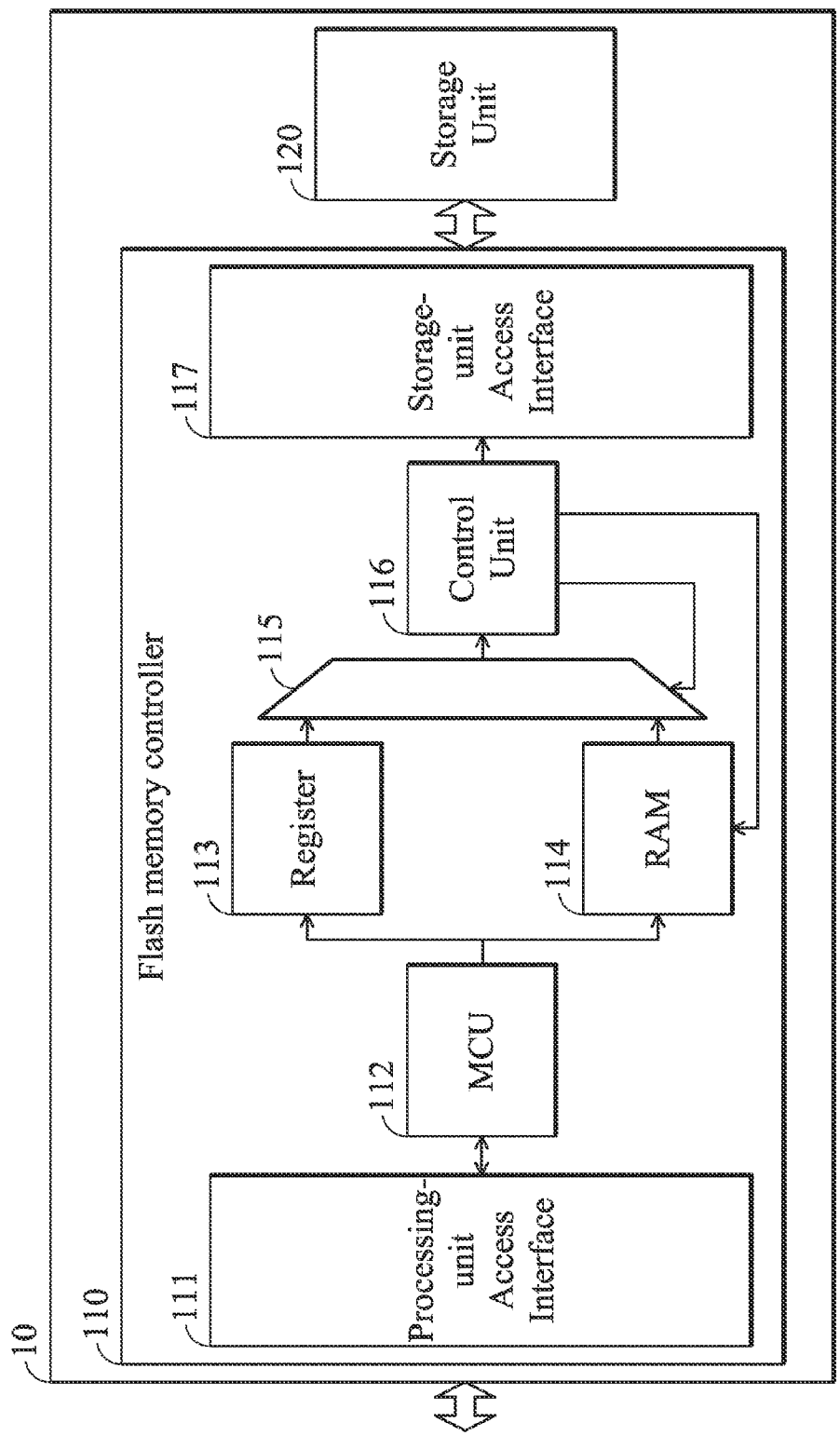
FIG. 1 is the system architecture of a flash memory according to an embodiment of the invention.

Embodiments of the invention introduce methods for executing data access commands to reduce the requisite consecutive time period for writing registers, and flash memory devices using the same. Therefore, a firmware may gain higher flexibility to optimize a scheduling to multiple data access commands. The flash memory devices may be SD (Secure Digital) memory cards. FIG. 1 is the system architecture of a flash memory according to an embodiment of the invention. The system architecture 10 of the flash memory contains a control unit 116 being configured to obtain commands, addresses, parameters, data or other associated information from a register 113 or a RAM (Random Access Memory) 114, and then access a storage unit 120 accordingly. Specifically, the control unit 116 programs data into a designated address of the storage unit 120 through a storage-unit access interface 117 and reads data from a designated address thereof through the same interface 117. Several electrical signals are used in the system architecture 10 for coordinating commands and data transfer between the control unit 116 and the storage unit 120, including data lines, a clock signal and control lines. The data lines are employed to transfer commands, addresses and data to be programmed to the storage unit 120 and to be read from the storage unit 120. The control lines are utilized to issue control signals, such as the ALE (Address Latch Enable), the CLE (Command Latch Enable), the WE (Write Enable), etc. A MCU (Micro-Control Unit) 112 may communicate with other electronic devices through a processing-unit access interface 111 using a standard protocol, such as USB (Universal Serial Bus), ATA (Advanced Technology Attachment), etc.

Figure 2:
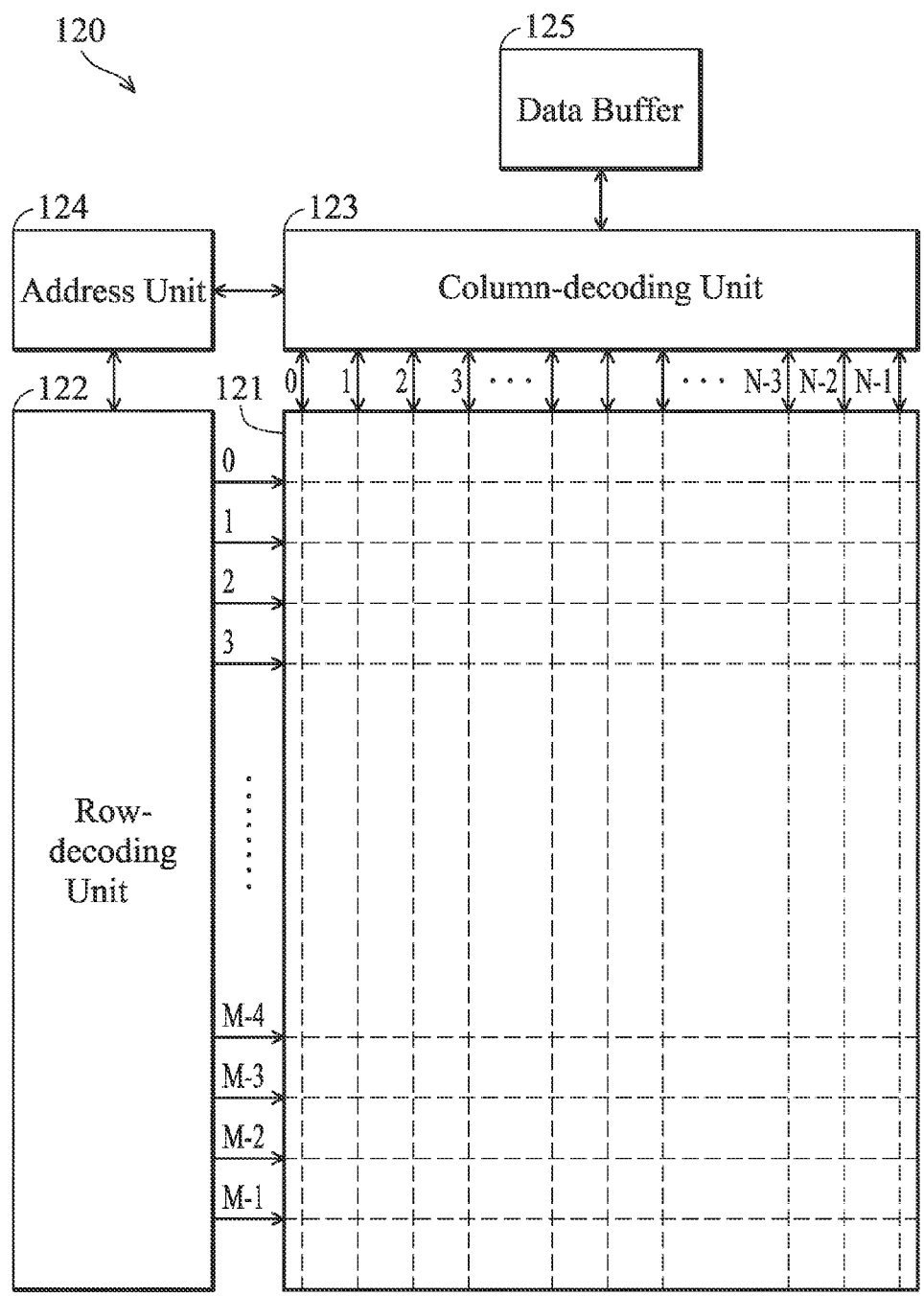
FIG. 2 shows a schematic diagram depicting a storage unit of a flash memory according to an embodiment of the invention.

FIG. 2 shows a schematic diagram depicting a storage unit of a flash memory according to an embodiment of the invention. The storage unit 120 includes a memory cell array 121 composed of M×N memory cells, and each memory cell may include one or more SLCs (Single-Level Cells), MLCs (Multi-Level Cells) or TLCs (Triple-Level Cells). The flash memory may be a NOR or NAND flash memory, etc. In order to appropriately access desired information, a row-decoding unit 122 is used to select appropriate rows for access. Similarly, a column-decoding unit 123 is employed to select an appropriate number of bytes within the row for output. An address unit 124 applies row information to the row-decoding unit 122 defining which of the N rows of the memory cell array 121 is to be selected for reading or writing. Similarly, the column-decoding unit 123 receives address information defining which one or ones of the M columns of the memory cell array 121 are to be selected from the address unit 124. Data read from or to be applied to the memory cell array 121 is stored in a data buffer 125.

Figure 3:
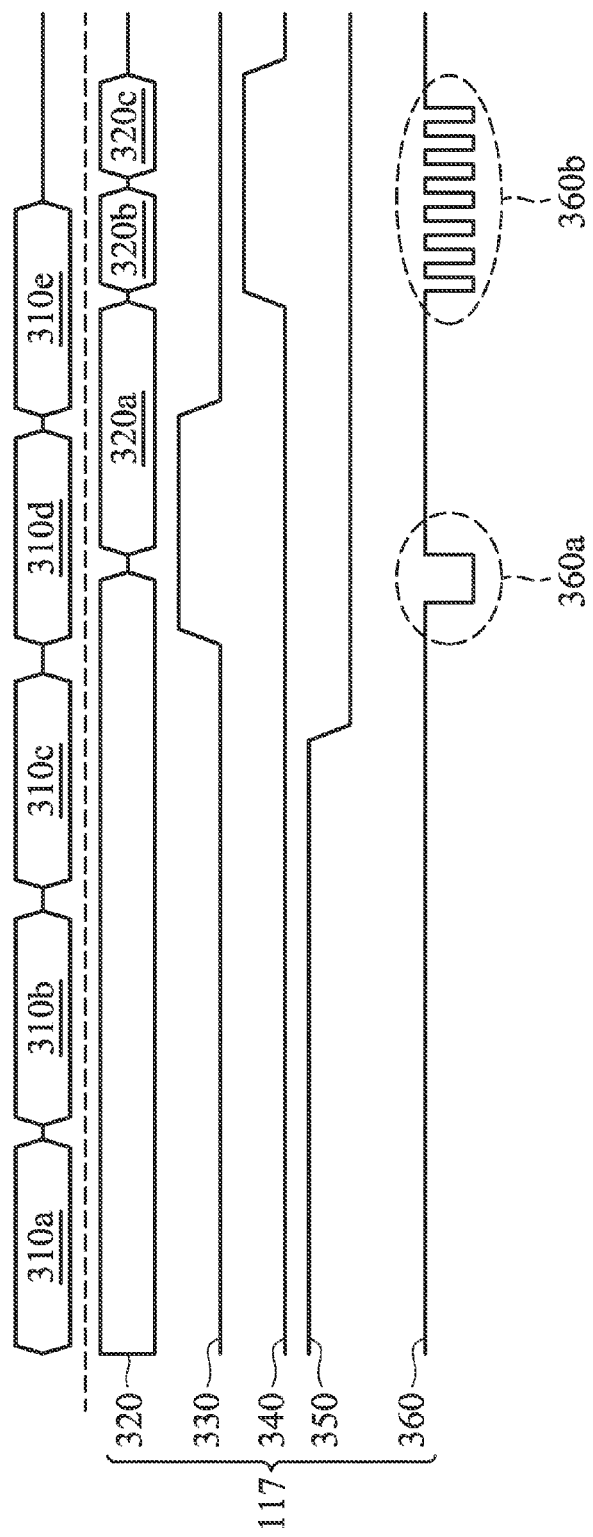
FIG. 3 shows a timing diagram for programming data into a storage unit by writing interface-driving instructions into a register according to an embodiment of the invention.

Under normal conditions, a multiplexer 115 is configured to connect the register 113 to the control unit 116. The control unit 116 may periodically detect whether a new interface-driving instruction has been written in the register 113. If so, the control unit 116 may accordingly modify control signals of the storage-unit access interface 117, enable or disable a clock signal of the storage-unit access interface 117, place data on a data line of the storage-unit access interface 117, read data via a data line of the storage-unit access interface 117, or any combination thereof. The storage-unit access interface 117 may employ the SDR (Single Data Rate) or the DDR (Double Data Rate) protocol, such as the ONFI (Open NAND Flash Interface), the DDR toggle interface, or a similar but different interface, enabling the control unit 116 to communicate with a controller (not shown) of the storage unit 120. A firmware when being executed by the MCU 112, in response to a data access command received from the processing-unit access interface 111, may write a series of interface-driving instructions into the register 113, causing the control unit 116 to complete an operation through the storage-unit access interface 117, such as reading data from a designated address range of the storage unit 120, programming data into a designated address range of the storage unit 120, merging designated pages of the storage unit 120, etc. FIG. 3 shows a timing diagram for programming data into a storage unit by writing interface-driving instructions into a register according to an embodiment of the invention. The firmware may sequentially write the specified values 310a and 310b into the register 113, causing the control unit 116 to obtain a program address and an associated parameter. Then, the specified value 310c is written into the register 113, causing the control unit 116 to assert the CE control signal 350. After detecting that the specified value 310d is written into the register 113, the control unit 116 asserts the CLE control signal 330, places the program command 320a on the data line 320, and generates the WE toggling signal 360a, causing a controller (not shown) of the storage unit 120 to read the program command 320a via the data line 320. For example, the control unit 116 may latch the program command 320a via the data line 320 at the rising edge of the toggling signal 360a. After detecting that the specified value 310e is written into the register 113, the control unit 116 asserts the ALE control signal 340, places program addresses 320b and 320b on the data line 320, and generates the WE toggling signal 360b, causing the controller (not shown) of the storage unit 120 to obtain the program addresses 320b and 320c via the data line 320. For example, the control unit 116 may obtain the program addresses 320b and 320c via the data line 320 at rising or/and falling edges of the toggling signal 360b. The values 310a to 310e suggest a series of interface-driving instructions to be executed consecutively. For completing a program command, the firmware arranges a time period enough to write the series of interface-driving instructions into the register 113. In some cases, a total number of interface-driving instructions may be up to twenty for responding to a data access command from the processing-unit access interface 111.

Figure 4:
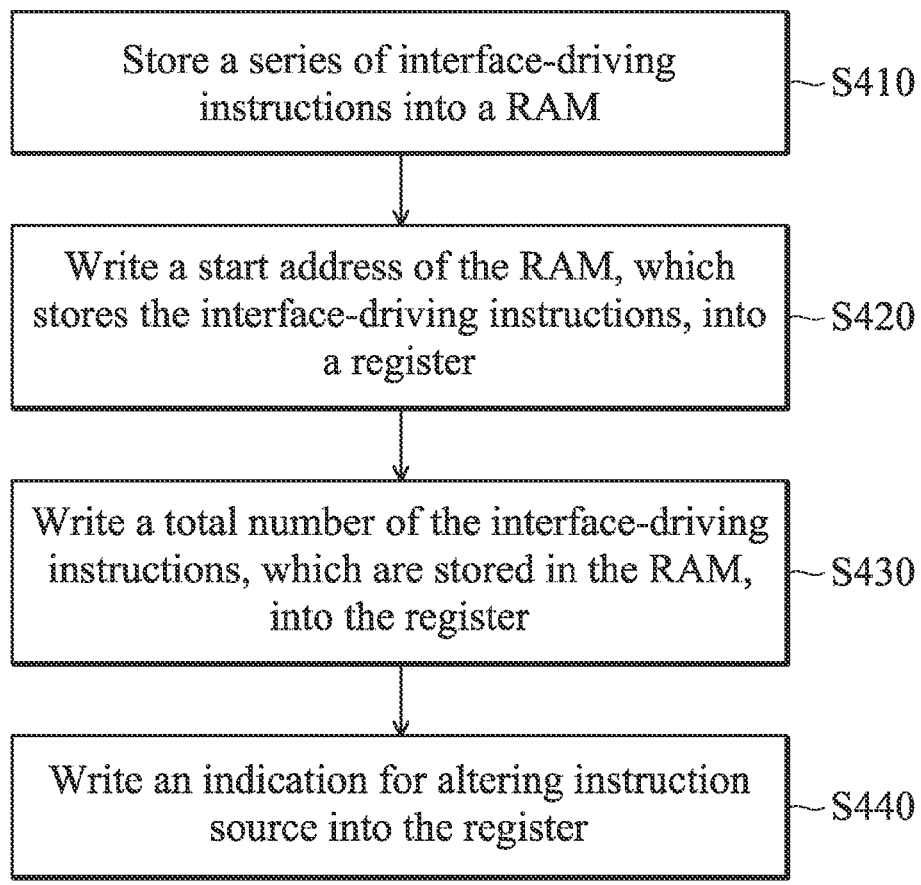
FIG. 4 is a flowchart illustrating a method for generating interface-driving instructions, performed by a firmware when being executed, according to an embodiment of the invention.
Figure 5:
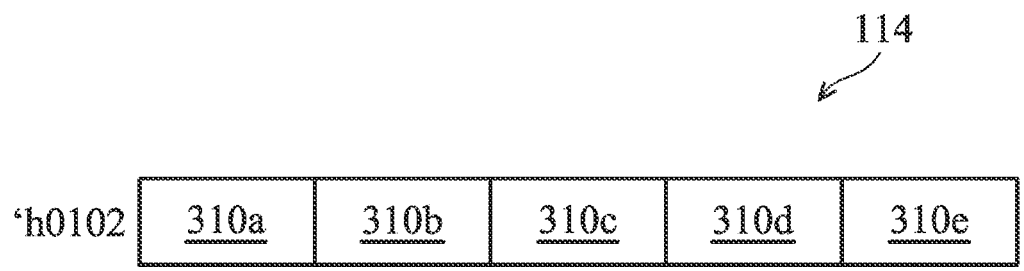
FIG. 5 is a schematic diagram of a storage of interface-driving instructions according to an embodiment of the invention.

To reduce the continuous time period requisite for writing registers, embodiments of the invention introduce a predefined instruction, other than the aforementioned interface-driving instructions, instructing the control unit 116 to read a specified number of interface-driving instructions from a designated address of the RAM 114, so as to complete a data access command. The predefined instruction may be referred to as an indication for altering the instruction source. Before writing the special command into the register 113, the firmware may store a series of interface-driving instructions in the RAM 114 and write a start address for storing the interface-driving instructions and a total number of interface-driving instructions into the register 113. FIG. 4 is a flowchart illustrating a method for generating interface-driving instructions, performed by a firmware when being executed, according to an embodiment of the invention. The firmware, when being executed by the MCU 112, stores a series of interface-driving instructions into the RAM 114, rather than the register 113 (step S410). The firmware may perform step S410 at requisite moments for one or more data access commands. For example, the written interface-driving instructions may associate with one data read command and one data program command. FIG. 5 is a schematic diagram of a storage of interface-driving instructions according to an embodiment of the invention. The discussed interface-driving instructions 310a to 310e may be stored in the RAM 114 with a start address "h0102". The firmware subsequently writes the start address of the RAM 114, which stores the interface-driving instructions 310a to 310e, into the register 113 (step S420), and a total number of interface-driving instructions 310a to 310e, which are stored in the RAM, into the register 113 (step S430). At a moment needed to trigger the storage-unit interface 117, the firmware writes the indication for altering instruction source into the register 113 for instructing the control unit 116 to read a specified number of the interface-driving instructions from the RAM 114, so as to complete a data access command received from the processing-unit access interface 111 (step S440). It should be noted that the moments for performing step S410 are arbitrarily arranged by the firmware and may be independent from the moments for performing steps S420 to S440. In other words, the firmware may store interface-driving instructions associated with several data access commands in the RAM 114 in advance, and at requisite moments, arrange to perform steps S420 to S440 for instructing the control unit 116 to read and execute the stored interface-driving instructions from the RAM 114. After writing the start address and the total number of the interface-driving instructions, which are stored in RAM 114, and the indication for altering the instruction source into the register 113, the firmware can perform other tasks without waiting for the completion of the interface-driving instructions by the control unit 116.

Figure 6:
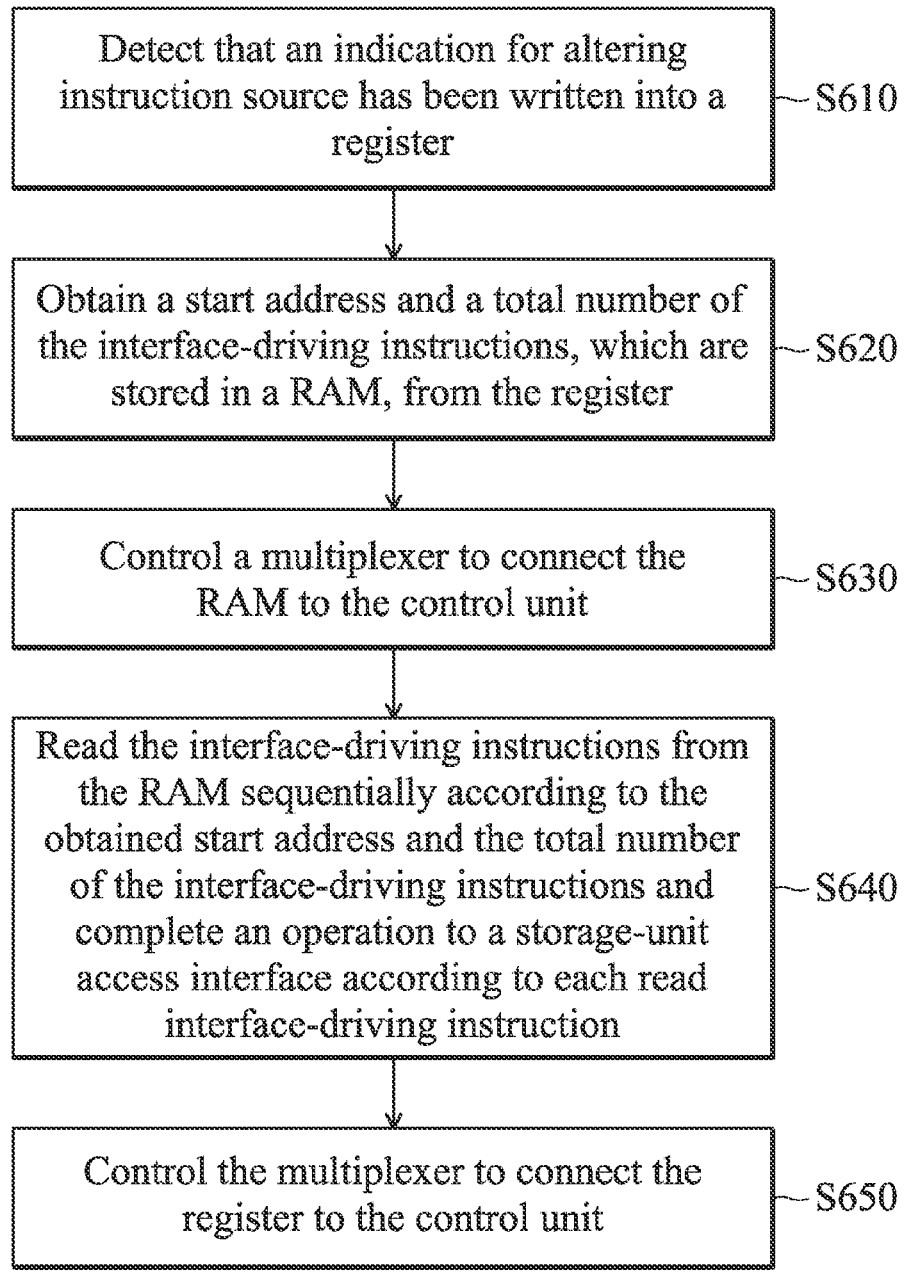
FIG. 6 is a flowchart illustrating a method for executing interface-driving instructions, performed by the control unit 116, according to an embodiment of the invention.

FIG. 6 is a flowchart illustrating a method for executing interface-driving instructions, performed by the control unit 116, according to an embodiment of the invention. After detecting that the indication for altering instruction source has been written into the register 113 (step S610), the control unit 116 obtains the start address and the total number of the interface-driving instructions, which are stored in the RAM 114, from the register 113 (step S620). The start address and the total number of the interface-driving instructions are written in the register 113 when the firmware performs steps S420 and S430. For example, the register 113 records that the start address of the interface-driving instructions is "h0102" and the total number of the interface-driving instructions is "5". Subsequently, the multiplexer 115 is controlled to connect the RAM 114 to the control unit 116 (step S630). The control unit 116 sequentially reads the interface-driving instructions from the RAM 114 according to the obtained start address and the total number of the interface-driving instructions and completes an operation to the storage-unit access interface 117 according to each read interface-driving instruction (step S640). Exemplary interface-driving instructions stored in the RAM 114 may refer to FIG. 5. After reading the interface-driving instructions completely, the control unit 116 controls the multiplexer 115 to connect the register 113 to the control unit 116 (step S650), causing the control unit 116 to continue the periodical detection of the values being written in the register 113.

Figure 7:
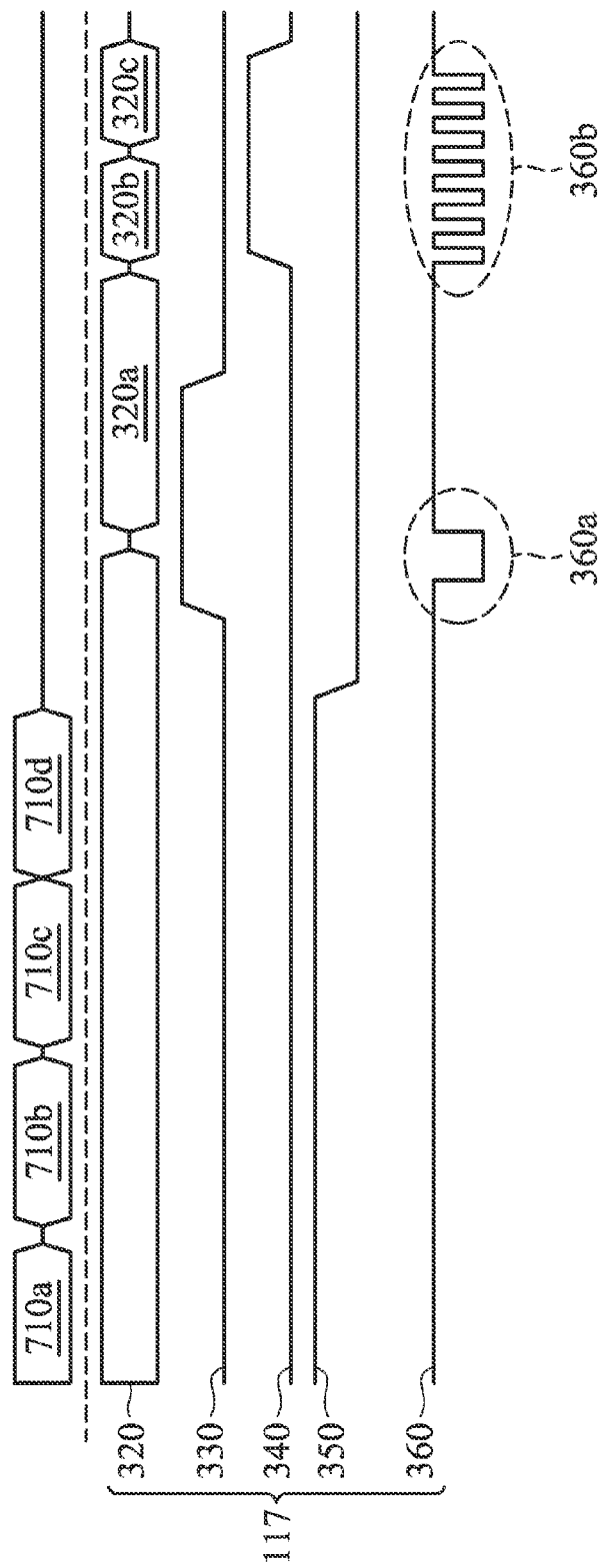
FIG. 7 shows a timing diagram for programming data into a storage unit with the pre-stored interface-driving instructions in a RAM according to an embodiment of the invention.

FIG. 7 shows a timing diagram for programming data into a storage unit with the pre-stored interface-driving instructions in a RAM according to an embodiment of the invention. The firmware may store a series of interface-driving instructions in a designated address range of the RAM 114 in advance (step S410). In this case, the interface-driving instructions are used to program data into a designated region of the storage unit 120. When reaching a proper moment, the firmware may write a start address 710a and 710b of the RAM 114, which stores the series of interface-driving instructions, into the register 113 (step S420), and write a total number 710c of the interface-driving instructions into the register 113 (step S430). The start address 710a and 710b is designated by 16 bits (i.e. 2 bytes). Those skilled in the art may use more bits to suggest the start address, and the invention should not be limited thereto. Subsequently, the indication for altering the instruction source is written into the register 113 (step S440). Please refer to FIG. 5. In this case, the start address is "h0102", and the total number of the interface-driving instructions is "5". After recognizing the indication for altering the instruction source 710d (step S610), the control unit 116 reads the recorded start address 710a and 710b and total number 710c of the interface-driving instructions from the register 113 (step S620). The control unit 116 subsequently controls the multiplexer 1159 to connect the RAM 114 to the control unit 116 (step S630). The control unit 116 sequentially reads the interface-driving instructions from the RAM 114 according to the obtained start address 710a and 710b and the total number 710c of the interface-driving instructions and completes an operation to the storage-unit access interface 117 according to each read interface-driving instruction (step S640). Details of the operations to the data line 320, the CLE control signal 330, the ALE control signal 340, the CE control signal 350 and the WE control signal 360 of the storage-unit access interface 117 may refer to the description of FIG. 3. Finally, the control unit 116 controls the multiplexer 115 to connect the register 113 to the control unit 116 (step S650), so as to continue the detection of the values newly written into the register 113.

Although the embodiment has been described as having specific elements in FIGS. 1 and 2, it should be noted that additional elements may be included to achieve better performance without departing from the spirit of the invention. While the process flows described in FIGS. 4 and 6 include a number of operations that appear to occur in a specific order, it should be apparent that these processes can include more or fewer operations, which can be executed serially or in parallel (e.g., using parallel processors or a multi-threading environment).

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for executing data access commands, performed by a control unit, comprising:
   storing a series of interface-driving instructions that is received from firmware in a RAM (Random Access Memory);
   periodically detecting whether an interface-driving instruction or an indication for altering instruction source has been written into a register;
   operating a storage-unit access interface according to the interface-driving instruction of the register after detecting that the interface-driving instruction has been written into the register by the firmware;
   reading the series of interface-driving instructions from the RAM after detecting that the indication has been written into the register by the firmware; and
   operating the storage-unit access interface according to the interface-driving instructions read from the RAM, so as to complete data access to a storage unit,
   wherein the control unit stores the series of interface-driving instructions in the RAM at a first moment independent from a second moment for operating the storage-unit access interface according to the series of interface-driving instructions of the RAM in response to the indication for altering instruction source by the firmware.

2. The method of claim 1, further comprising:
   controlling a multiplexer to connect the RAM to the control unit after detecting that the indication for altering instruction source has been written into the register.

3. The method of claim 2, further comprising:
controlling the multiplexer to connect the register to the control unit after reading the interface-driving instructions from the RAM.

4. The method of claim 1, further comprising:
obtaining a start address and a total number of interface-driving instructions, which are stored in the RAM, from the register and controlling a multiplexer to connect the RAM to the control unit after detecting that the indication for altering instruction source has been written into the register,
wherein the interface-driving instructions are read from the RAM according to the obtained start address and the total number of the interface-driving instructions.

5. The method of claim 1, wherein the operation of the storage-unit access interface comprises a data access on a data line or modifying a control signal.

6. The method of claim 1, wherein the interface-driving instructions are stored in the RAM by the firmware when being executed by a MCU (Micro-Control Unit).

7. The method of claim 1, wherein the indication for altering instruction source is written by the firmware when being executed by a MCU (Micro-Control Unit).

8. A flash memory device, comprising:
a storage-unit access interface;
a register;
a RAM (Random Access Memory); and
a control unit, coupled between the register, the RAM and the storage-unit access interface, storing a series of interface-driving instructions that is received from firmware in the RAM; periodically detecting whether an interface-driving instruction or an indication for altering instruction source has been written into a register; operating the storage-unit access interface according to the interface-driving instruction of the register after detecting that the interface-driving instruction has been written into the register by the firmware; reading the series of interface-driving instructions from the RAM after detecting that the indication has been written into the register by the firmware; and operating the storage-unit access interface according to the interface-driving instructions read from the RAM, so as to complete data access to a storage unit,
wherein the control unit stores the series of interface-driving instructions in the RAM at a first moment independent from a second moment for operating the storage-unit access interface according to the series of interface-driving instructions of the RAM in response to the indication for altering instruction source by the firmware.

9. The flash memory device of claim 8, further comprising:
a multiplexer, coupled between the register, the RAM and the control unit,
wherein the control unit controls the multiplexer to connect the RAM to the control unit after detecting that the indication for altering instruction source has been written into the register.

10. The flash memory device of claim 9, wherein the control unit controls the multiplexer to connect the register to the control unit after reading the interface-driving instructions from the RAM.

11. The flash memory device of claim 8, further comprising:
a multiplexer, coupled between the register, the RAM and the control unit,
wherein the control unit obtains a start address and a total number of interface-driving instructions, which are stored in the RAM, from the register and controls the multiplexer to connect the RAM to the control unit after detecting that the indication for altering instruction source has been written into the register, and
wherein the interface-driving instructions are read from the RAM according to the obtained start address and the total number of the interface-driving instructions.

12. The flash memory device of claim 8, wherein the operation of the storage-unit access interface comprises a data access on a data line or modifying a control signal.

13. The flash memory device of claim 8, wherein the interface-driving instructions are written into the RAM by the firmware when being executed by a MCU (Micro-Control Unit).

14. The flash memory device of claim 8, wherein the indication for altering instruction source is written by the firmware when being executed by a MCU (Micro-Control Unit).

15. A method for executing data access commands, performed by a firmware when being executed by a MCU (Micro-Control Unit), comprising:
under a first condition, writing a first interface-driving instruction into a register, causing a control unit to complete an operation through a storage-unit access interface; and
under a second condition, storing a series of second interface-driving instructions into a RAM (Random Access Memory) other than the register; and
under the second condition, writing an indication for altering instruction source into the register for instructing the control unit to read the second interface-driving instructions from the RAM at a needed moment, instead of arranging a time period to write the register, and operate the storage-unit access interface according to the second interface-driving instructions from the RAM,
wherein the firmware stores the series of interface-driving instructions via the control unit at a moment independent from the needed moment for writing the indication for altering instruction source into the register.

16. The method of claim 15, further comprising:
writing a start address and a total number of the second interface-driving instructions, which are stored in the RAM, into the register,
wherein the control unit reads the interface-driving instructions according to the start address and the total number of the second interface-driving instructions.

17. The method of claim 15, wherein the control unit performs a data access on a data line of the storage-unit access interface or modifies a control signal of the storage-unit access interface according to the first and second interface-driving instructions.

* * * * *